United States Patent
Siwinski

(10) Patent No.: US 7,012,588 B2
(45) Date of Patent: Mar. 14, 2006

(54) METHOD FOR SAVING POWER IN AN ORGANIC ELECTROLUMINESCENT DISPLAY USING WHITE LIGHT EMITTING ELEMENTS

(75) Inventor: Michael J. Siwinski, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 746 days.

(21) Appl. No.: 09/874,128

(22) Filed: Jun. 5, 2001

(65) Prior Publication Data

US 2002/0186214 A1 Dec. 12, 2002

(51) Int. Cl.
*G09G 3/22* (2006.01)

(52) U.S. Cl. .......................... 345/83; 345/76; 345/211

(58) Field of Classification Search ................ 345/82, 345/83, 76, 211; 315/169.1, 169.2, 169.3
See application file for complete search history.

(56) References Cited

U.S. PATENT DOCUMENTS

| | | | |
|---|---|---|---|
| 5,167,024 A * | 11/1992 | Smith et al. ................ 713/322 |
| 5,278,681 A | 1/1994 | Gitlin et al. | |
| 5,537,650 A | 7/1996 | West et al. | |
| 5,598,565 A * | 1/1997 | Reinhardt .................... 713/323 |
| 5,790,096 A * | 8/1998 | Hill, Jr. ....................... 345/600 |
| 5,944,829 A * | 8/1999 | Shimoda ...................... 713/324 |
| 5,966,393 A * | 10/1999 | Hide et al. ..................... 372/23 |
| 6,069,440 A * | 5/2000 | Shimizu et al. ............. 313/486 |
| 6,088,066 A | 7/2000 | Westerman | |
| 6,127,693 A * | 10/2000 | Chen et al. .................... 257/40 |
| 6,133,692 A * | 10/2000 | Xu et al. ..................... 313/506 |
| 6,140,986 A | 10/2000 | Wilkinson et al. | |
| 6,311,282 B1 * | 10/2001 | Nelson et al. .............. 713/324 |
| 6,552,711 B1 * | 4/2003 | Nakamura .................. 345/102 |

OTHER PUBLICATIONS

Saheh and Teich, Fundamentals of Photonics (New York: John Wiley & Sons, Inc. 1991) pp. 600-605.*
Richard C. Dorf, ed., The Electrical Engineering Handbook (Boca Raton: CRC Press, 1993) pp. 1766-1668.*

* cited by examiner

*Primary Examiner*—Amr A. Awad
(74) *Attorney, Agent, or Firm*—Andrew J. Anderson; Thomas H. Close

(57) ABSTRACT

A method of saving power in a color organic electroluminescent display of the type having color emitting elements with different light emitting efficiencies, includes the steps of: providing a organic electroluminescent color display having colored light emitting elements and white light emitting elements; converting at least a portion of a color digital image to be displayed on the display to a monochrome image; and displaying the monochrome image portion using only the white light emitting elements.

10 Claims, 2 Drawing Sheets

METHOD FOR SAVING POWER IN AN ORGANIC ELECTROLUMINESCENT DISPLAY USING WHITE LIGHT EMITTING ELEMENTS

FIELD OF THE INVENTION

This invention relates generally to organic electroluminescent displays, and more particularly, to a method for reducing the power consumed by an organic electroluminescent display.

BACKGROUND OF THE INVENTION

Full color organic electroluminescent flat panel displays such as organic light emitting diodes (OLEDs) consist of two dimensional arrays of discrete light emitting diodes. A common configuration for such a device includes columns of alternating red, green and blue (RGB) emitting diodes. Another common configuration consists of closely placed triplets of light emitting diodes, each triplet consisting of one each of a red, green and blue light emitting diode.

Color organic electroluminescent flat panel displays are presently planned for wide use in battery powered portable electronic devices such as personal computers, digital assistants and cellular telephones. A common problem with such apparatus is the limited time of operation before the battery must be replaced or recharged. One approach to saving power is to automatically put the device into a minimum power usage sleep mode if there has been no active use of the device for a predetermined time. This approach however is not very useful if the device is continually in use. There is a need therefore for an improved method of conserving power.

SUMMARY OF THE INVENTION

The need is met according to the present invention by providing a method of saving power in a color organic electroluminescent display of the type having color emitting elements with different light emitting efficiencies, that includes the steps of: providing an organic electroluminescent color display having colored light emitting elements and white light emitting elements; converting at least a portion of a color digital image to be displayed on the display to a monochrome image; and displaying the monochrome image portion using only the white light emitting elements.

ADVANTAGES

The present invention has the advantage that power can be saved while continuing to use the display device.

DETAILED DESCRIPTION OF THE INVENTION

The present invention describes a method of conserving power in a portable OLED device. OLEDs create a color image by emitting colored light at each individual pixel site. The OLED has a useful property in that the only light emitting elements that consume power are the light emitting elements that are turned on. In other words, the power consumed by the OLED device can be reduced by turning individual light emitting elements off. It is also commonly known that the various colors of OLED materials do not create light with the same efficiencies. The present invention describes an OLED display device which contains red, green, blue and white light emitting elements. The white light emitting elements are at least twice as efficient as the red and blue light emitting elements. This provides a method for displaying white and shades of gray on an OLED display device. This display mode will save power by using efficient white light emitting elements to display white and shades of gray, instead of fabricating white light using the less efficient red and blue light emitting elements.

For applications which consist of a substantial amount of user interaction with a graphical user interface, the use of full color is not always necessary. Most user interfaces use a substantial amount of white and/or shades of gray for displaying menus, dialog buttons, dialog boxes, page backgrounds, etc. For a battery driven portable application, it would be desirable to provide a power efficient method of displaying white and shades of gray on a full color OLED display.

A typical active matrix OLED display has red, green and blue light emitting elements. When all of the light emitting elements are off, the display consumes a minimum of power, and the display appears black. When all of the light emitting elements are turned on, the red, green and blue light mixes, and the display appears white. The materials used to produce the different colors of light do not have the same efficiencies. Some of the materials will produce more light output than others, for a given amount of input current. The green light emitting materials are the most efficient, and may be as much as four or five times as efficient as the blue material, which is the least efficient. In one example, the red light emitting elements emit 4 candelas/ampere, the green emit 10 candelas/ampere, and the blue emit 2 candelas/ampere.

For many OLED display applications, the user would be viewing non-pictorial data, such as text and user interface items such as menus, dialog boxes, dialog box buttons, etc. Also, computer applications such as word processing, email and web browsing typically use a majority of white and shades of gray for the application window, menus and page background.

Figure 1:
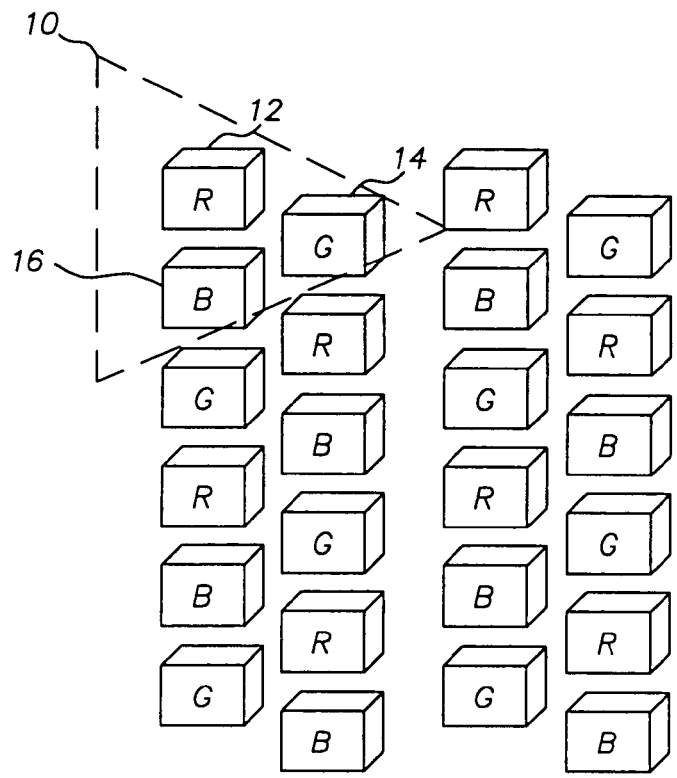
FIG. 1 is a schematic diagram showing the arrangement of light emitting elements on a prior art organic electroluminescent display.

FIG. 1 shows one typical prior art arrangement pattern 10 for the red 12, green 14 and blue 16 light emitting elements in a triad pattern. This display can only display white or gray scale colors by turning on all three colors in the triad.

Figure 2:
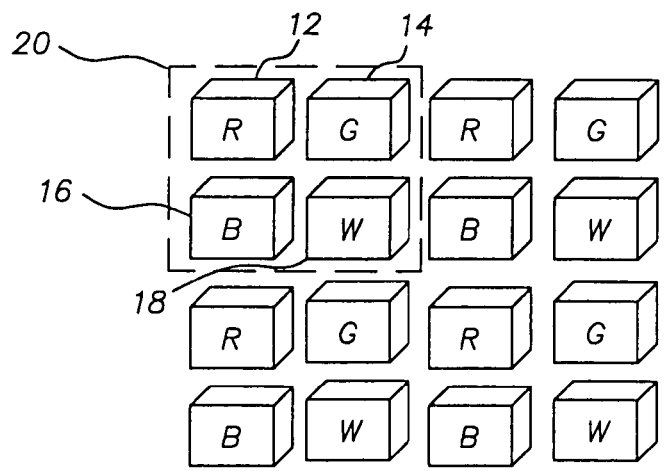
FIG. 2 is a schematic diagram showing the arrangement of light emitting elements on an organic electroluminescent display useful with the present invention.

FIG. 2 shows an OLED display for use according to the present invention that contains four different colors of display light emitting elements; red 12, green 14, blue 16 and white 18, arranged in a quad pattern 20. The white emitting elements can be higher efficiency than one or more of the other elements. For example, the white emitting elements 18 may have a light emitting efficiency of 5 candelas/ampere. An electronic device using this display could use only the more efficient white light emitting elements to display white and gray scale colors, and use the less efficient red and blue light emitting elements only when those colors were needed. For example, if a pixel of white light having 3 candelas of brightness were to be produced using the red, green and blue elements, the total amperes required would be ¼ ampere for the red, ⅒ ampere for the green and ½ ampere for the blue, for a total of 17/20 of an ampere. In comparison, using the white emitting pixel having a light emitting efficiency of 5 candelas/amp, ⅗ or 12/20 of an amp is required, thereby realizing a 29% efficiency in power usage.

An additional power saving mode could use the white light emitting elements only to display pictorial content in a monochrome fashion. It is commonly known that the luminance content of a colored image can be represented by adding together a weighted portion of each of the intensities of the red, green and blue components of the image. For example, the luminance of a colored pixel can be represented by:

$$\text{Luminance} = (5/16) * \text{red} + (9/16) * \text{green} + (2/16) * \text{blue}$$

This luminance could be displayed on the efficient white light emitting elements, which would allow for a high quality monochrome rendering of the pictorial content. This monochrome mode would also display high quality user interface items such as menus, dialog boxes, and application page backgrounds.

Figure 3:
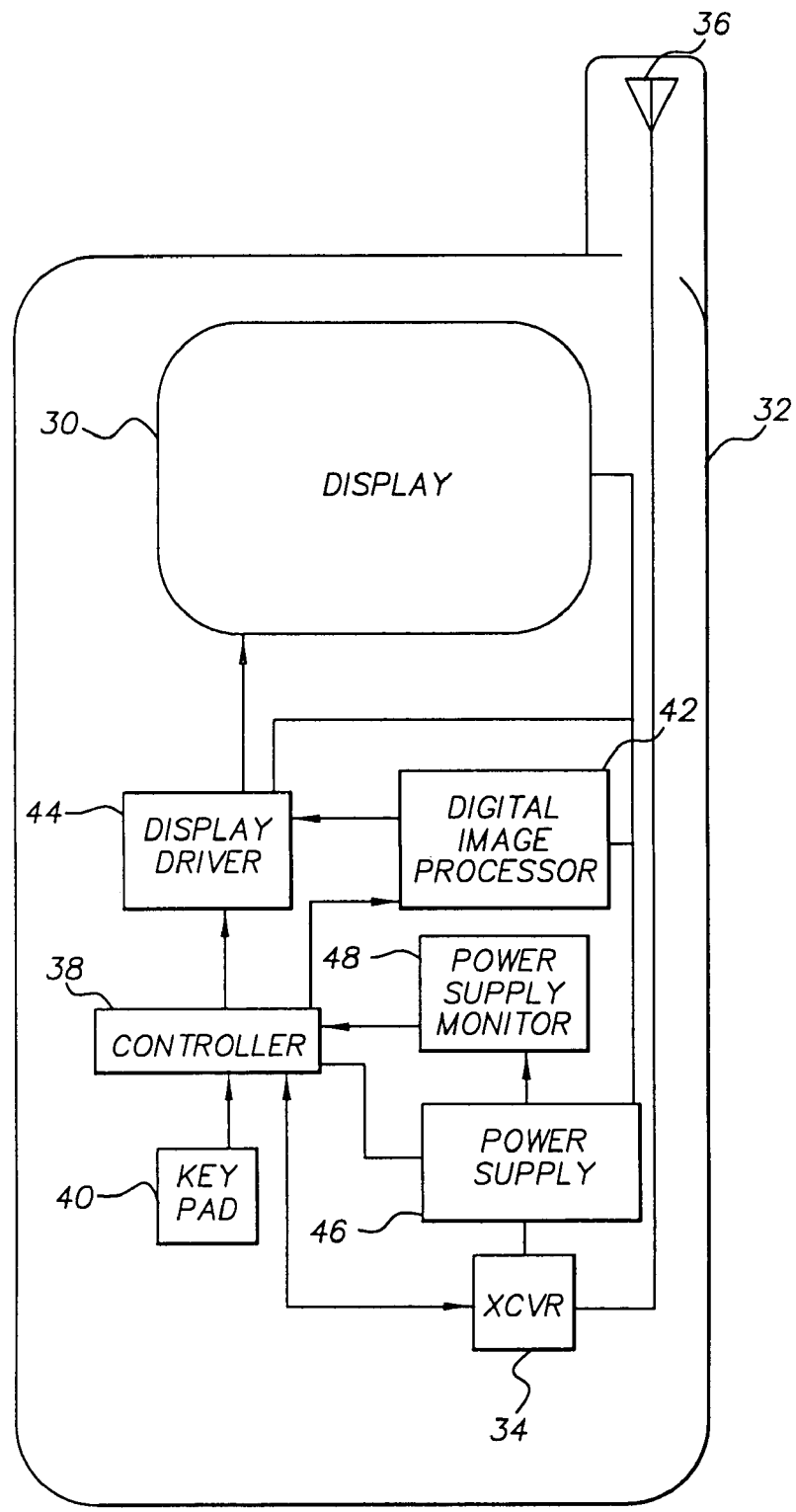
FIG. 3 is a schematic block diagram of a battery powered cell phone having an organic electroluminescent display capable of being operated in a power saving mode according to the present invention.

Referring to FIG. 3, in certain portable applications, such as a cellular telephone 32, it may be acceptable to switch from a full power, full color mode to a low power monochrome mode. The cell phone 32 includes a full color OLED display 30 having colored and white light emitting elements as shown in FIG. 2. A transceiver 34 is connected to an antenna 36 and a controller 38. The cell phone is operated by a keypad 40 connected to the controller. The controller sends signals to a digital image processor 42 that in turn sends processed digital image signals to a display driver 44 that drives the display 10. A power supply, such as a battery pack 46 supplies power to the components of the cell phone, including the display 30. A power supply monitor 48 is connected to the power supply 46 and signals the controller as to state of charge of the batteries in the power supply.

When the battery 46 is low on stored power, it may be more important to use the remaining power to receive and transmit, than to display full color on the OLED display 30. This low power monochrome mode can be achieved by converting the full color RGB color image to a luminance only gray scale image as described above in the digital image processor 42, and displaying that monochrome image on the white light emitting elements (only) of the OLED display 30. The inefficient red and blue light emitting elements would all be turned off, and the image would be displayed on the more efficient white light emitting elements. The low power mode of operation can be selected manually, for example by a code that is input into the keypad 40, or automatically by the controller in response to the signal provided by the power supply monitor 48.

It is also possible to realize further power savings to switch to a green only monochrome image as disclosed in copending U.S. application No. 09/874,147 filed concurrently by Siwinski. This switchover could be accomplished manually at the choice of the viewer, or automatically in response to the battery reaching some lower charge level. For the manual mode of switching, a separate battery saving switch can be provided on the apparatus that includes the display, or in apparatus having a keypad, a special combination of keystrokes can be employed to activate the power saving feature. A touch screen display may also be used to implement the battery saving mode switch.

The present invention is also useful in devices such as laptop computers and personal digital assistants, for example, by providing the option to switch to a power saving mode when doing tasks such as word processing that don't necessarily require full color.

The invention has been described in detail with particular reference to certain preferred embodiments thereof, but it will be understood that variations and modifications can be effected within the spirit and scope of the invention.

PARTS LIST

| | |
|---|---|
| 10 | triad pixel pattern |
| 12 | red light emitting element |
| 14 | green light emitting element |
| 16 | blue light emitting element |
| 18 | white light emitting element |
| 20 | quad pattern |
| 30 | display |
| 32 | cellular telephone |
| 34 | transceiver |
| 36 | antenna |
| 38 | controller |
| 40 | keypad |
| 42 | image processor |
| 44 | display driver |
| 46 | battery pack |
| 48 | power supply monitor |

What is claimed is:

1. A method of saving power in a color organic electroluminescent display of the type having color emitting elements with different light emitting efficiencies, comprising the steps of:
   a) providing an organic electroluminescent color display having colored light emitting elements and white light emitting elements having light emitting efficiencies greater than at least one of the colored light emitting elements;
   b) converting at least a portion of a color digital image to be displayed on the display to a monochrome image; and
   c) displaying the monochrome image portion using only the white light emitting elements whereby power is saved.

2. The method claimed in claim 1, wherein the display is in a battery powered device, and further comprising the step of monitoring the power level of the battery, and converting to a power saving mode of operation when the battery power reaches a predetermined level.

3. The method claimed in claim 1, further comprising the steps of: providing a battery saving mode switch on a device that includes the color organic electroluminescent display, and switching to a battery saving mode using the mode switch.

4. The method claimed in claim 1, wherein the step of converting a color digital image to a monochrome digital image comprises combining 5/16, 9/16, and 2/16 of the red, green and blue color signals, respectively.

5. A color organic electroluminescent display, comprising:
   a) a plurality of differently colored light emitting elements having different light emitting efficiencies and white light emitting elements having light emitting efficiencies greater than at least one of the colored light emitting elements;

b) a digital image processing circuit for converting at least a portion of a color digital image to be displayed on the display to a monochrome image; and c) means for displaying the monochrome portion of the image using only the white light emitting elements whereby power is saved.

6. The display claimed in claim 5, wherein the display is in a battery powered device, and further comprising a power monitor for monitoring the power level of the battery, and a control circuit connected to power monitor for converting the display to a power saving mode of operation when the battery power reaches a predetermined level.

7. The display claimed in claim 5, further comprising a battery saving mode switch connected to the control circuit for switching to a battery saving mode.

8. The display claimed in claim 5, wherein the digital image processing circuit converts a color digital image to a monochrome digital image by combining $5/16$, $9/16$, and $2/16$ of the red, green and blue color signals, respectively.

9. An OLED device, comprising:

a) a pixel site including a plurality of individually addressable light emitting elements including a light emitting element for emitting white light and one or more light emitting elements for emitting colored light; and b) the white light emitting element having a light emitting efficiency at least twice that of at least one of the colored light emitting elements.

10. A method of saving power in an OLED display device, comprising:

a) providing an OLED display having pixel sites with colored light emitting elements and white light emitting elements, the white light emitting element having a light emitting efficiency at least twice that of at least one of the colored light emitting elements;

b) converting at least a portion of a digital color image signal to a power saving digital image signal using the white light emitting elements; and c) driving the OLED display with the power saving digital image signal.

\* \* \* \* \*